United States Patent [19]
Iranmanesh

[11] Patent Number: 5,440,167
[45] Date of Patent: Aug. 8, 1995

[54] ANTIFUSE WITH DOUBLE VIA CONTACT AND METHOD OF MANUFACTURE THEREFOR

[75] Inventor: Ali Iranmanesh, Sunnyvale, Calif.

[73] Assignee: Crosspoint Solutions, Inc., Santa Clara, Calif.

[21] Appl. No.: 200,262

[22] Filed: Feb. 23, 1994

[51] Int. Cl.⁶ .................. H01L 27/02; H01L 45/00; H01L 21/44; H01L 21/48
[52] U.S. Cl. .................................. 257/530; 257/30; 437/51; 437/190; 437/192; 437/922
[58] Field of Search ............... 257/50, 530; 437/51, 437/190, 192, 922

[56] References Cited

U.S. PATENT DOCUMENTS

| | | | |
|---|---|---|---|
| 4,217,374 | 8/1980 | Ovshinsky et al. | 257/50 |
| 4,226,898 | 10/1980 | Ovshinsky et al. | 257/50 |
| 4,499,557 | 2/1985 | Holmberg et al. | 257/530 |
| 5,100,827 | 3/1992 | Lytle | 257/530 |
| 5,284,788 | 2/1994 | Spratt et al. | 257/530 |

OTHER PUBLICATIONS

G. H. Chapman et al., "A Laser Linking Process for Restructurable VLSI", *CLEO '82* (Apr. 1982) 5 pages.

*Primary Examiner*—J. Carroll
*Attorney, Agent, or Firm*—Townsend and Townsend Khourie and Crew

[57] ABSTRACT

The present invention provides for a method of forming an antifuse in an integrated circuit having a first insulating layer on a semiconductor substrate. The method comprises forming a first metal interconnection layer on the first insulating layer; forming a programming layer on the first metal interconnection line; forming a relatively thin, second insulating layer over the programming layer; forming a first aperture through the second insulating layer where the antifuse is to be located to expose a portion of the programming layer; forming a barrier metal layer on the second insulating layer and in said first aperture to contact the portion of said programming layer; forming a relatively thick, third insulating layer on the barrier metal layer; forming a second aperture to expose a portion of the barrier metal layer; and forming a second metal interconnection layer on the third insulating layer and in the second aperture to contact the portion of the second barrier metal layer.

15 Claims, 7 Drawing Sheets

ANTIFUSE WITH DOUBLE VIA CONTACT AND METHOD OF MANUFACTURE THEREFOR

BACKGROUND OF THE INVENTION

The present invention is related to integrated circuit structure and processing technology and, more particularly, to antifuses in integrated circuits and their manufacture.

Antifuses are found in a growing number of integrated circuits, most of which are field programmable gate arrays (FPGAs). As the name implies, antifuses have a very high resistance (to form essentially an open circuit) in the unprogrammed ("off") state, and a very low resistance (to form essentially a closed circuit) in the programmed ("on") state. In these integrated circuits antifuses are placed at the intersections of interconnection lines which lead to different elements of the integrated circuit. By programming selected antifuses, the interconnections between the various elements of the integrated circuit are formed to define the function of the device.

In a typical antifuse structure a programming layer of amorphous silicon is sandwiched between two metal interconnection lines. Depending upon the material of each metal interconnection layer and the programming layer, a layer of barrier metal, such as TiW (titanium-tungsten), may be added to the interconnection line to lie between the programming layer and each metal interconnection layer. Barrier metal layers function to block the undesired interdiffusion of a programming layer, such as amorphous silicon, and a metal layer, such as aluminum alloy. Barrier metal layers are typically refractory metals, their intermetallics, alloys, silicides, nitrides and combinations thereof.

However, various problems have been found with present antifuses. A problem is reliability. One failure mechanism is that $R_{ON}$ is sometimes unstable. With use, the programmed resistance of the antifuse sometimes drifts and increases to very high values which result in a device failure. For the programmed FPGA, the failure of one antifuse is disastrous since the programmed circuit is no longer realized in the integrated circuit.

An antifuse structure described in U.S. Pat. No. 5,100,827, which issued on Mar. 31, 1992 to S. A. Lytle, attempts to solve this problem. The described antifuse addresses the problem of poor step coverage of an amorphous silicon programming layer which is deposited into vias through an interlayer dielectric. Nonetheless, the antifuse fails to account for the parasitic capacitances of the unprogrammed antifuse structure. Such a failure results in the poor performance of an integrated circuit having a large number of antifuses. In present FPGAs the number of antifuses range from tens to hundreds of thousands of antifuses and thus the antifuse in the described patent offers greater reliability in exchange for poorer performance.

The present invention solves or substantially mitigates both problems of reliability and performance.

SUMMARY OF THE INVENTION

The present invention provides for a method of forming an antifuse in an integrated circuit having a first insulating layer on a semiconductor substrate. The method comprises forming a first metal interconnection layer on the first insulating layer; forming a programming layer on the first metal interconnection line; forming a relatively thin, second insulating layer over the programming layer; forming a first aperture through the second insulating layer where the antifuse is to be located to expose a portion of the programming layer; forming a barrier metal layer on the second insulating layer and in said first aperture to contact the portion of said programming layer; forming a relatively thick, third insulating layer on the barrier metal layer; forming a second aperture to expose a portion of the barrier metal layer; and forming a second metal interconnection layer on the third insulating layer and in the second aperture to contact the portion of the second barrier metal layer.

The present invention also provides for an antifuse structure in an integrated circuit, which has a first interconnection line over a first insulating layer; a programming layer over the first insulating layer and on the first interconnection line; a relatively thin insulating layer on the programming layer, the relatively thin insulating layer having a first aperture exposing a portion of a top surface of the programming layer; a barrier metal layer over the relatively thin insulating layer and in the first aperture to contact the programming layer; a relatively thick insulating layer on the barrier metal layer, the relatively thick insulating layer having a second aperture exposing a portion of a top surface of the barrier metal layer; and a second interconnection line over the relatively thick insulating layer and in the second aperture contacting the portion of the first barrier metal layer top surface.

In the resulting antifuse the programming layer is relatively flat to permit more consistent programming voltages for said antifuse structure and a more uniform conducting link between the first and second interconnection lines. The capacitance of an unprogrammed antifuse is reduced since a significant portion of the antifuse's capacitance is defined by the dimensions of the aperture through the insulating layer over the programming layer. Furthermore, since a barrier metal layer, rather than the programming layer, fills the via, the thickness of the insulating layer may be accordingly adjusted to reduce the capacitive coupling between the antifuse conducting layers which have the insulating layer (and the programming layer) between. The barrier metal layer is less likely to encounter step coverage problems in the via.

BRIEF DESCRIPTION OF THE DRAWINGS

A more detailed understanding of the present invention may be achieved by perusing the following Detailed Description Of Preferred Embodiments of the present invention with reference to the following drawings.

DETAILED DESCRIPTION OF PREFERRED EMBODIMENTS

Figure 1A:
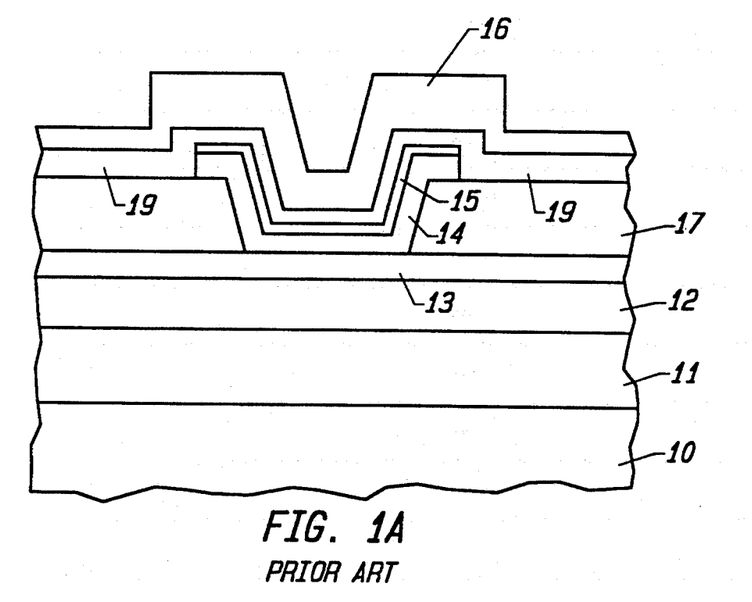
FIG. 1A is a cross-sectional diagram of a representative antifuse found in the prior art.

FIG. 1A shows a cross-sectional view of a typical antifuse. For all the drawings, it should be noted that the various details were not drawn to scale, but were made to illustrate the various points of the present invention. The antifuse has a first metal interconnection layer 12 on top of an insulating layer 11 of silicon dioxide. The insulating layer 11 is formed on top of a semiconductor substrate 10 upon whose surface are formed the various elements of an integrated circuit. These elements, such as transistors, are not shown in the drawings.

The first metal layer 12 is typically formed from aluminum alloy. A first barrier metal layer 13 is formed on top of the first metal layer 12. The layers 12 and 13 are delineated into one set of metal interconnection lines for the integrated circuit. A second, thick insulating layer 17 of silicon dioxide, typically 5000 to 12000 Å thick, is placed over the first metal layer 12 and first barrier metal layer 13. By an deep aperture, or via, through the layer 17, a semiconductor programming layer 14 of amorphous silicon is formed on top of the second insulating layer 17 and in the via to contact the first barrier metal layer 13. As explained above, the barrier metal layer 13 prevents the interdiffusion of the aluminum in the metal layer 12 with the silicon in the amorphous silicon layer 14.

On top of the amorphous silicon layer 14, there is placed a thin barrier metal layer 15, which protects the underlying amorphous silicon layer 14 during subsequent processing. An antifuse mask is used to delineate the layers 14 and 15 in the via and its surrounding regions. A third barrier metal layer 19, which is followed by a second metal layer 16 of aluminum alloy, is deposited in contact with the barrier metal layer 15 and the edge of the amorphous silicon layer 14. The layers 16 and 19 are delineated into another set of metal interconnection lines for the integrated circuit.

When an antifuse is programmed by placing a large voltage across the metal interconnection lines (the layers 12, 13 and the layers 16, 19), a conducting link is formed through the semiconductor programming layer 14 between the barrier metal layers 13 and 15 typically at the corners of the antifuse in the via through the insulating layer 17. The conducting link is formed by the higher electric fields at the corners at the beginning of the programming process. These fields cause a breakdown of the amorphous silicon in the layer 14 at those locations and the resulting high current densities melt the barrier metal layers 13 and 15 and the intermediate layer 14 into the fused link.

Figure 1B:
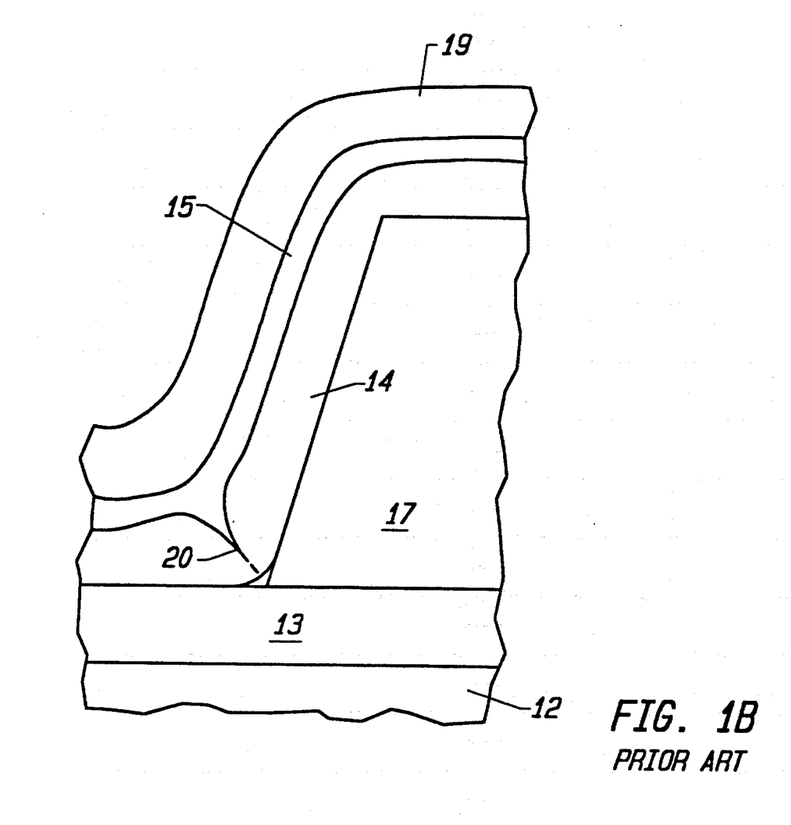
FIG. 1B is a detail of one corner of the antifuse of FIG. 1A.

As noted above, there are problems with present day antifuses. The resistance of a programmed antifuse can vary from wafer to wafer, or even from antifuse to antifuse within an integrated circuit. The source of this problem appears to be the location of the conducting link and the difficulty in obtaining uniform layers of amorphous silicon and barrier metal in the via connecting the two interconnection lines. FIG. 1B shows the folding of the amorphous silicon layer 14 in the corners of the via through the insulating layer 17. The thickness of the chemical vapor deposited amorphous silicon in the corners is difficult to control and hence leads to varying programming voltages for the antifuses and problems of step coverage of the subsequent layers formed in the deep via in the insulating layer between the two interconnection lines. The deep via even affects the step coverage of the barrier metal and aluminum layers which form the second interconnection line.

To overcome these problems, the present invention provides for an antifuse which has good step coverage for all these layers for lowered $R_{ON}$ and increased reliability. A deep via for the programming layer is avoided so that the programming layer is flat, or relatively flat. Additionally, the antifuse structure in its unprogrammed state has a limited capacitance which aids the performance of the integrated circuit containing the antifuse. In an FPGA the capacitance of tens, if not hundreds, of antifuses on an interconnection has a significant effect upon the performance of the integrated circuit.

FIGS. 2A-2G illustrate the steps of manufacturing an antifuse according to one embodiment of the present invention. A first interconnection line is formed on an insulating layer 20 which covers the various integrated circuit elements, such as transistors, in the substrate (not shown). An aluminum alloy layer 21 is deposited, followed by a barrier metal layer 22 of titanium-tungsten. Then a programming layer 25 of amorphous silicon is deposited by plasma-enhanced chemical vapor deposition. The amorphous silicon contains hydrogen from 8-12% by atomic weight. For a desired programming voltage of approximately 8 volts, the thickness of the amorphous silicon programming layer 25 ranges from 700 to 900 Å.

Figure 2A:
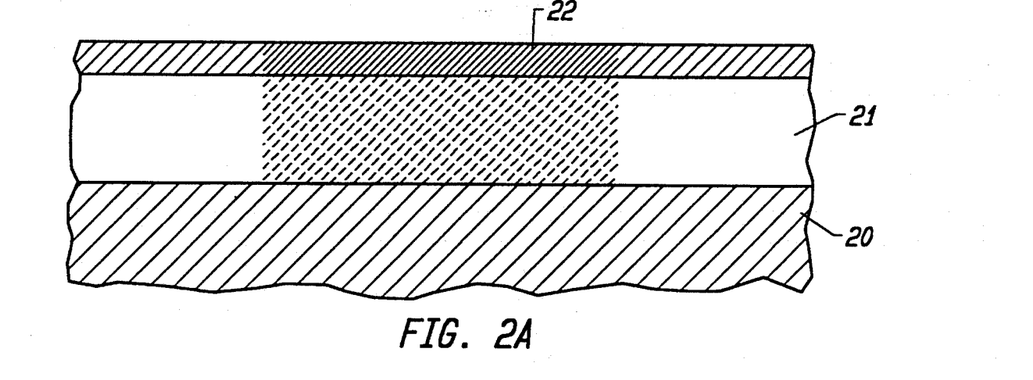
FIGS. 2A–2F illustrate a sequence of steps used to manufacture an antifuse structure according to an embodiment of the present invention.
Figure 2B:
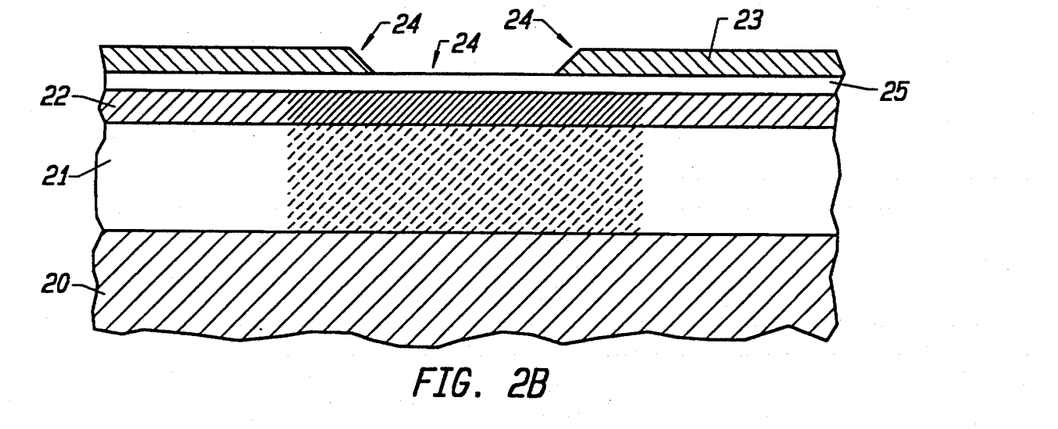

As shown in FIG. 2B, a relatively thin insulating layer 23 is then deposited over the programming layer 25 and first interconnection line, formed by the layers 21 and 22 and the first insulating layer 20. The layer 23 is deposited by chemical vapor deposition to a thickness in the range of 2500 to 3000 Å. The layer 23 is formed from silicon dioxide, such as undoped silicate glass, phosphosilicate glass (PSG), or borophosphosilicate glass (BPSG). With standard photolithographic and etching techniques and a via mask, a via 24 is formed in the insulating layer 23 to expose a portion of the top surface of the programming layer 25 where the antifuse is to be located.

Figure 2C:
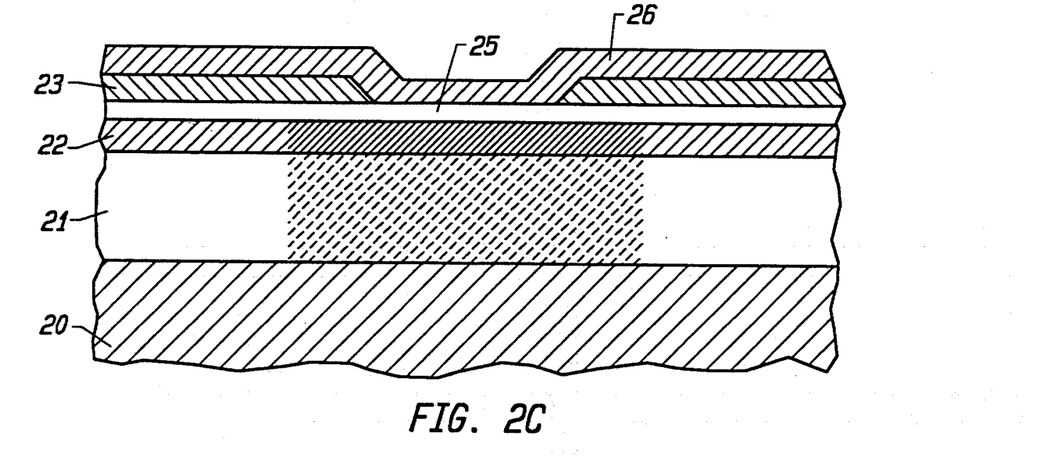

A barrier metal layer 26 of TiW is then deposited over the silicon dioxide layer 23 and into the via 24 to contact the top surface of the programming layer 25. The barrier metal layer 26 is deposited by sputtering to a thickness of 1000 to 2000 Å, as illustrated in FIG. 2C.

Figure 2D:
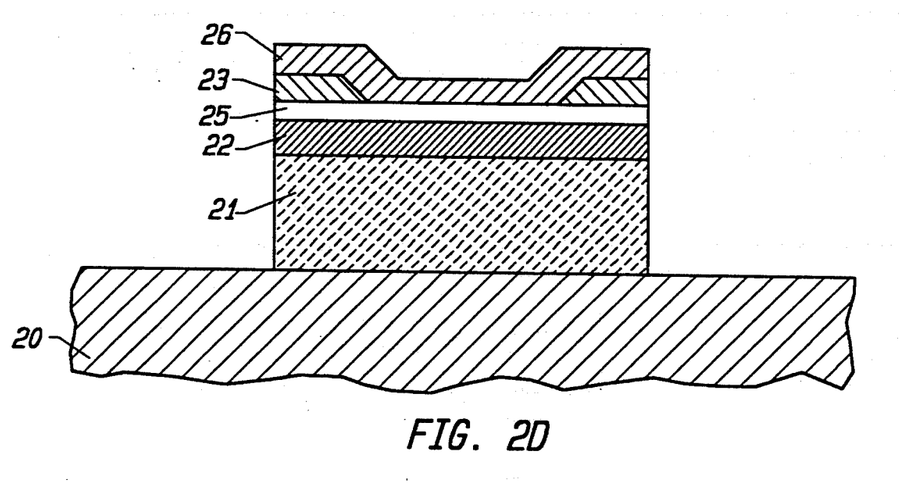

Masking and etching operations are then performed. First, the layer 26 is defined in the direction along which the first interconnection line, formed by the layers 21 and 22, is to be defined. As shown, this direction is perpendicular to the plane of the drawings. With a first interconnection line mask, the layers 21, 22, 25, 23 and 26 are masked and etched to define the set of first interconnection lines formed by aluminum alloy layer 21 and barrier metal layer 22 in the integrated circuit. As shown in FIG. 2D, this operation also defines the layers 23, 25, and 26 in the direction perpendicular to the direction of the first interconnection line on which the antifuse is placed, i.e., right and left in the plane of the drawing. The layers 23, 25 and 26 are self-aligned with the sides of the layers 21 and 22.

Figure 2E:
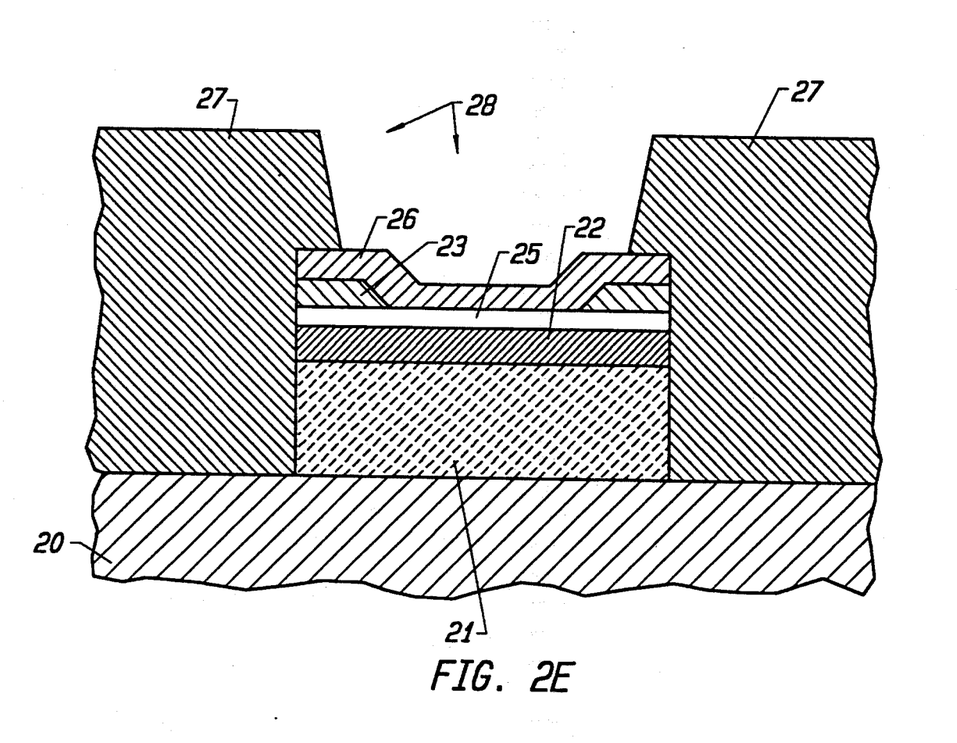

A thick insulating layer 27 of silicon dioxide, which forms the interlayer dielectric, is deposited to blanket the layers 21–26. From the top surface of the first insulating layer 20 the layer 27, which may be formed from undoped silicate glass, BPSG, or PSG, has a thickness in the range from 5000 to 12000 Å. As shown in FIG. 2E, a via 28 is defined and formed through the layer 27 to expose a top surface of the barrier metal layer 26. By sputtering, a barrier metal layer 29 of titanium-tungsten is deposited to a thickness of 1000 to 2000 Å. This is followed by a layer 30 of aluminum alloy, sputtered to a thickness of 5000 to 7000 Å.

With a second interconnection line mask, the layers 29 and 30 are masked and etched by standard photolithographic and etching techniques. The second set of interconnection lines are formed from the TiW layer 29 and the aluminum alloy layer 30, as shown in FIG. 2F.

Figure 2F:
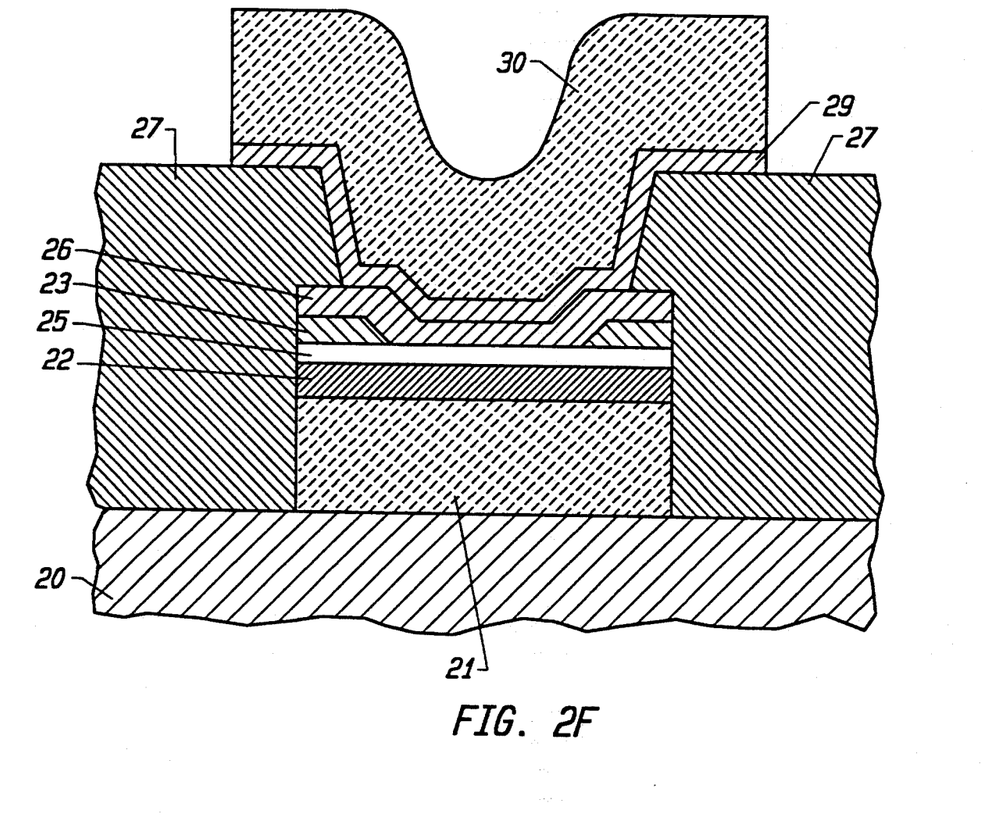

The completed antifuse structure is shown in FIG. 2F. Not shown are the layers, such as the passivating layers, which are deposited subsequently to complete the integrated circuit. The advantage of this antifuse is that the programming layer 25 of amorphous silicon is flat. This allows a more consistent and uniform deposition of the layer 25, as compared to the deposition in a via. Since the programming layer 25 is located below the via 24 in the silicon dioxide layer 23, there is no folding of the programming layer. This allows programming of the antifuse to be performed more consistently.

Furthermore, the antifuse structure has a capacitance limited partially by the area of the contact between the TiW layer 22 and the amorphous silicon layer 25. This area is defined by the via 24 through the insulating layer 23 and by the definition of the via mask, the capacitance of the antifuse may be controlled. There is still capacitive coupling between conducting barrier metal layers 22 and 26 in regions where the layers are separated by the insulating layer 23, besides the programming layer 25. The present invention allows the thickness of the silicon dioxide layer 23 to be adjusted so that this capacitive coupling can be reduced. Unlike the programming layer 25, the barrier metal layer is less sensitive to deposition into a via. Hence the layer 23 can be thickened and the via 24 deepened with less adverse consequences.

Figure 3A:
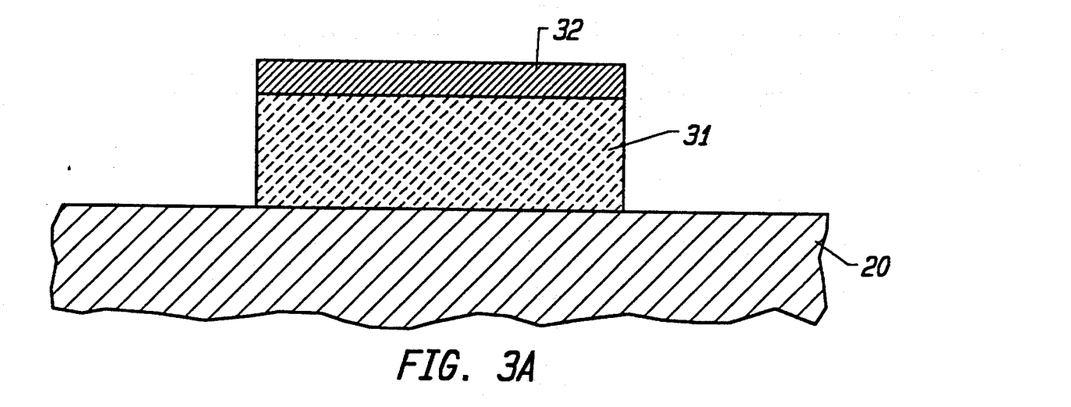
FIGS. 3A–3F illustrate a sequence of steps used to manufacture an antifuse structure according to another embodiment of the present invention.
Figure 3B:
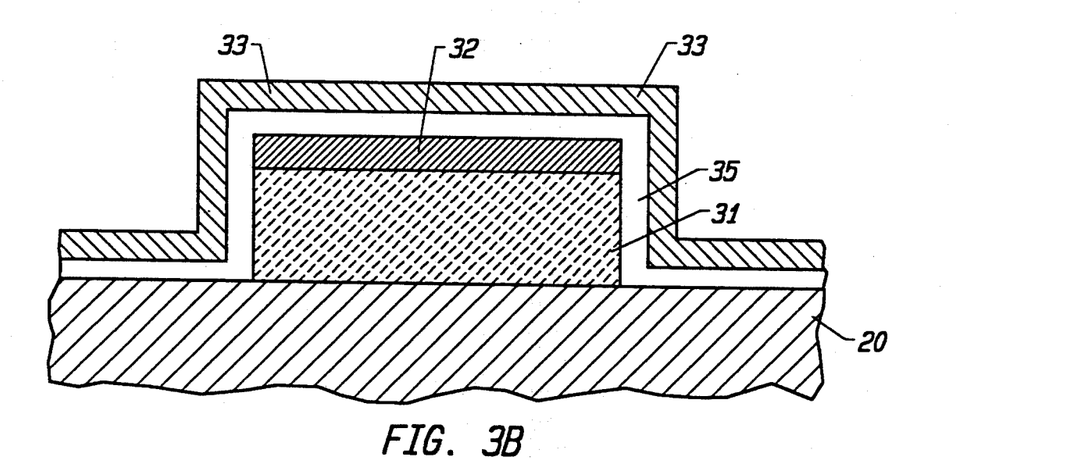

Another embodiment of the present invention is illustrated in FIGS. 3A–3F. In this embodiment the same masks and process steps described above are used, but the first interconnection line definition step illustrated in FIG. 2D is accelerated. After the deposition of the aluminum layer 31 and barrier metal layer 32 as illustrated in FIG. 2A, the first interconnection line is defined by masking and etching operations, shown in FIG. 3A. Then a programming layer 35 is deposited over the defined layers 21 and 22. Over the layer 35 is deposited a relatively thin layer 33 of silicon dioxide. The result is illustrated by FIG. 3B.

Figure 3C:
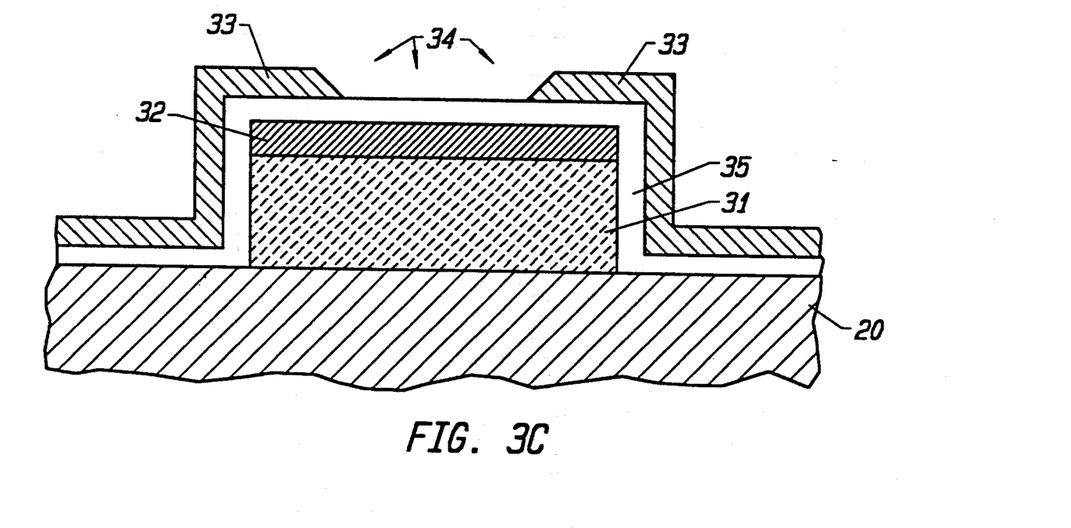

As described with respect to FIG. 2B, a via 34 is formed in the insulating layer 33 to expose a portion of the top surface of the programming layer 35 where the antifuse is to be located. This is illustrated in FIG. 3C.

Figure 3D:
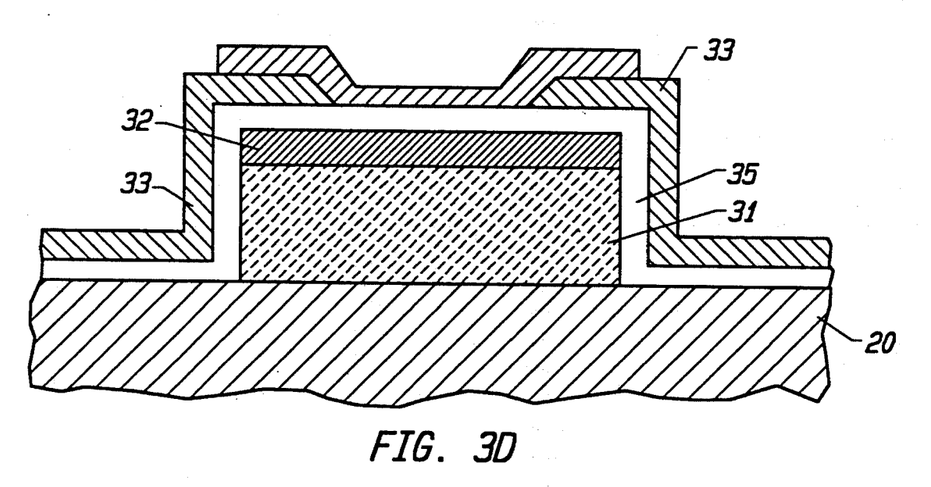

A barrier metal layer 36 of TiW is then deposited by sputtering over the silicon dioxide layer 33 and into the via 34 to contact the top surface of the programming layer 35. Masking and etching operations are then performed to define the layer 36 over the via 34 as shown in FIG. 3D.

Figure 3E:
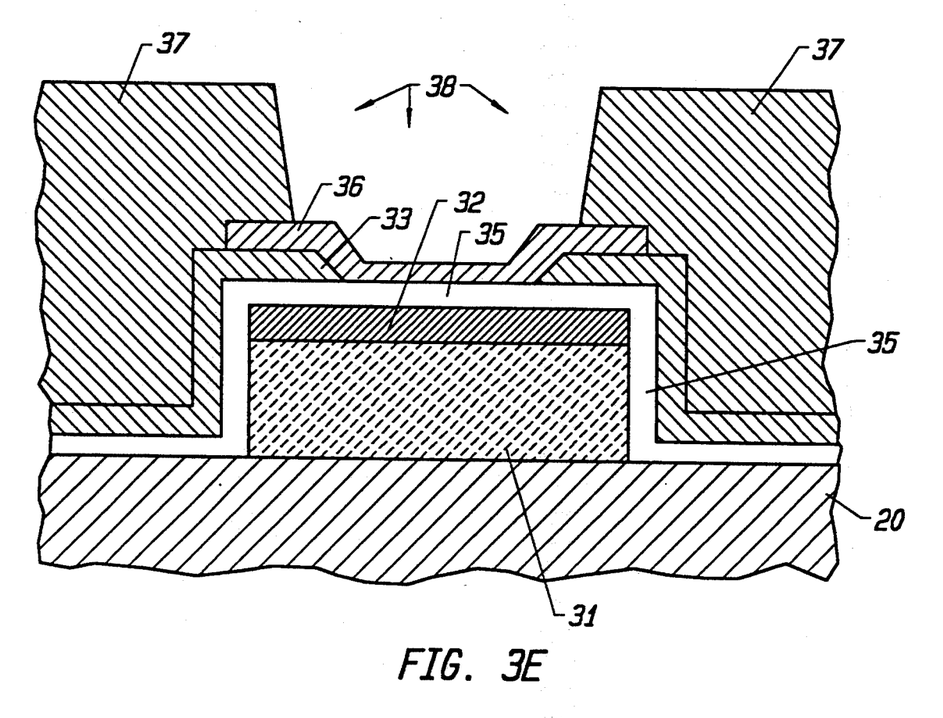
Figure 3F:
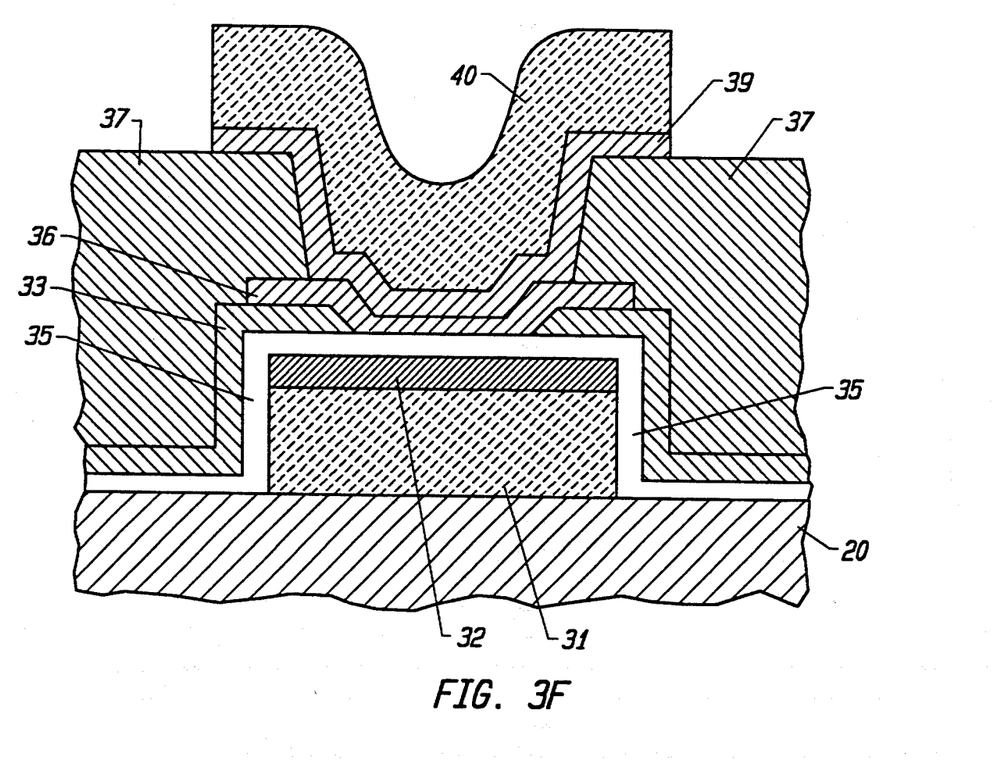

A thick insulating layer 37 of silicon dioxide, which forms the interlayer dielectric, is deposited to blanket the layers 31–36. As shown in FIG. 3E, a via 38 is defined and formed through the layer 37 to expose a top surface of the barrier metal layer 36. A barrier metal layer 39 of titanium-tungsten is then deposited and followed by a layer 40 of aluminum alloy. With the second interconnection line mask, the layers 39 and 40 are masked and etched, shown in FIG. 3F.

It should be noted that other materials, such as silicon dioxide and silicon nitride, may be used for the programming layer, besides amorphous silicon. However, with respect to a programming layer of amorphous silicon, oxygen in the range of 1–2% atomic weight may be added to reduce current leakage. This may be done by implanting the oxygen into the deposited programming layer or by adding oxygen during the deposition of the amorphous silicon layer. Of course, if the latter process is used, hydrogen should not be present simultaneously. Hydrogen maybe left out of the process entirely or included in the amorphous silicon deposition separately from the oxygen.

While the above is a complete description of the preferred embodiments of the invention, various alternatives, modifications and equivalents may be used. It should be evident that the present invention is equally applicable by making appropriate modifications to the embodiments described above. For example, the amorphous silicon layer doped with oxygen may be used as a programming layer in other antifuse structure than those disclosed above. Therefore, the above description should not be taken as limiting the scope of the invention which is defined by the appended claims.

What is claimed is:

1. An antifuse structure in an integrated circuit comprising
   a first interconnection line on a first insulating layer;
   a programming layer on said first interconnection line;
   a relatively thin insulating layer on said programming layer, said relatively thin insulating layer having a first aperture exposing a portion of a top surface of said programming layer;
   a first barrier metal layer over said relatively thin insulating layer and in said first aperture to contact said portion of said top surface of said programming layer;
   a relatively thick insulating layer on said first barrier metal layer, said relatively thick insulating layer having a second aperture exposing a portion of a top surface of said first barrier metal layer; and
   a second interconnection line over said relatively thick insulating layer and in said second aperture contacting said portion of said top surface of said first barrier metal layer;
   whereby said semiconductor programming layer is relatively flat to permit relatively consistent programming voltages for the antifuse structure and a relatively uniform conducting link between said first and second interconnection lines.

2. The antifuse structure of claim 1 wherein said relatively thin insulating layer is from 2500 to 3000 Å thick.

3. The antifuse structure of claim 1 wherein said relatively thick insulating layer is from 5000 to 12000 Å thick.

4. The antifuse structure of claim 3 wherein said programming layer comprises amorphous silicon having 1–2% oxygen by composition.

5. The antifuse structure of claim 4 wherein said programming layer is from 700 to 900 Å thick and has 8–12% hydrogen by composition.

6. The antifuse structure of claim 1 wherein said first interconnection line extends laterally in a first direction and has edges in a second lateral direction substantially perpendicular to said first direction, and said programming layer, said relatively thin insulating layer, and said first barrier metal layer each have edges, said edges of said programming layer, said relatively thin insulating layer and said first barrier metal layer aligned with said edges of said first interconnection line.

7. The antifuse structure of claim 1 wherein said first and second interconnection lines are each comprised of a barrier metal layer and an aluminum alloy layer.

8. A method of forming an antifuse in an integrated circuit having a first insulating layer on a semiconductor substrate, the method comprising forming a first metal interconnection layer on the first insulating layer;

forming a programming layer on said first metal interconnection layer; then forming a relatively thin, second insulating layer over said programming layer;

forming a first aperture through said second insulating layer where the antifuse is to be located;

forming a barrier metal layer on said second insulating layer and in said first aperture to contact said programming layer;

forming a relatively thick, third insulating layer on said barrier metal layer;

forming a second aperture to expose a portion of said barrier metal layer; and forming a second metal interconnection layer on said third insulating layer and in said second aperture to contact said portion of said second barrier metal layer;

whereby said programming layer is relatively flat to permit relatively consistent programming voltages for the antifuse and a relatively uniform conducting link between said first metal interconnection and said second metal interconnection lines.

9. The method of claim 8 further comprising masking and etching said first metal interconnection layer to define a first metal interconnection line, said first metal interconnection layer masking and etching step also including masking and etching said programming layer, said second insulating layer and said barrier metal layer to define edges of said layers.

10. The method of claim 8 further comprising masking and etching said first metal interconnection layer to define a first metal interconnection line before said programming layer is formed on said first metal interconnection layer.

11. The method of claim 8 wherein said second insulating layer forming step includes forming said second insulating layer to a thickness from 2500 to 3000 Å.

12. The method of claim 11, wherein said third insulating layer forming step includes forming said third insulating layer to a thickness from 5000 to 12000 Å.

13. The method of claim 8 wherein said programming layer forming step includes forming amorphous silicon including 1-2% oxygen by composition.

14. The method of claim 13 wherein said programming layer forming step includes forming amorphous silicon to a thickness from 700 to 800 Å and including 8 to 12% hydrogen by composition.

15. The method of claim 8 wherein said first metal interconnection and said second metal interconnection layers each comprise a barrier metal layer and an aluminum alloy layer.

* * * * *